United States Patent
Klein et al.

(10) Patent No.: US 11,538,726 B2
(45) Date of Patent: Dec. 27, 2022

(54) METHOD FOR FORMING PACKAGED SEMICONDUCTOR DIE WITH MICRO-CAVITY

(71) Applicant: Microchip Technology Inc., Chandler, AZ (US)

(72) Inventors: Matthias Klein, Berlin (DE); Andreas Zakrzewski, Potsdam (DE); Richard Gruenwald, Potsdam (DE)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 17/556,790

(22) Filed: Dec. 20, 2021

(65) Prior Publication Data

US 2022/0115282 A1 Apr. 14, 2022

Related U.S. Application Data

(62) Division of application No. 16/816,010, filed on Mar. 11, 2020, now Pat. No. 11,244,876.

(Continued)

(51) Int. Cl.
*H01L 21/56* (2006.01)
*H01L 23/16* (2006.01)
(Continued)

(52) U.S. Cl.
CPC ............ *H01L 23/16* (2013.01); *H01L 21/561* (2013.01); *H01L 23/3121* (2013.01);
(Continued)

(58) Field of Classification Search
CPC .... H01L 23/16; H01L 23/3121; H01L 21/561
See application file for complete search history.

(56) References Cited

U.S. PATENT DOCUMENTS

| 4,711,795 A | 12/1987 | Takeuchi et al. |
| 5,294,826 A | 3/1994 | Marcantonio et al. |

(Continued)

FOREIGN PATENT DOCUMENTS

| DE | 19806818 C1 | 11/1999 |
| DE | 10322135 A1 | 12/2004 |

(Continued)

OTHER PUBLICATIONS

PCTUS2020028261, International Search Report and Written Opinion, European Patent Office, dated Jul. 24, 2020.

*Primary Examiner* — Nicholas J Tobergte
(74) *Attorney, Agent, or Firm* — Glass and Associates; Kenneth Glass

(57) ABSTRACT

A method for forming a packaged electronic die includes forming a plurality of bonding pads on a device wafer. A photoresist layer is deposited over the device wafer and is patterned so as to form a photoresist frame that completely surrounds a device formed on the device wafer. Conductive balls are deposited over the bonding pads. The wafer is cut to form the electronic die and the electronic die is placed over the substrate. The conductive balls are heated and compressed, moving the electronic die closer to the substrate such that the photoresist frame is in direct contact with the substrate or with a landing pad formed on the substrate. Encapsulant material is deposited such that the encapsulant material covers the electronic die and the substrate. The encapsulant material is cured so as to encapsulate the electronic die. The substrate is cut to separate the packaged electronic die.

15 Claims, 12 Drawing Sheets

Related U.S. Application Data

(60) Provisional application No. 62/913,129, filed on Oct. 9, 2019.

(51) Int. Cl.
  *H01L 23/31* (2006.01)
  *H01L 23/00* (2006.01)

(52) U.S. Cl.
  CPC .............. *H01L 24/16* (2013.01); *H01L 24/94* (2013.01); *H01L 2224/16227* (2013.01)

(56) References Cited

U.S. PATENT DOCUMENTS

| | | | |
|---|---|---|---|
| 5,410,789 A | 5/1995 | Noto et al. | |
| 5,639,989 A | 6/1997 | Higgins, III | |
| 5,821,627 A * | 10/1998 | Mori | H05K 3/328 |
| | | | 257/781 |
| 5,900,581 A | 5/1999 | Ootake | |
| 5,969,461 A | 10/1999 | Anderson et al. | |
| 6,197,619 B1 | 3/2001 | Gaynes et al. | |
| 6,238,845 B1 | 5/2001 | Moehle et al. | |
| 6,262,513 B1 | 7/2001 | Furukawa et al. | |
| 6,335,223 B1 | 1/2002 | Takada et al. | |
| 6,472,724 B1 | 10/2002 | Matsuzawa et al. | |
| 6,492,194 B1 | 12/2002 | Bureau et al. | |
| 6,528,924 B1 | 3/2003 | Stelzl et al. | |
| 6,649,446 B1 | 11/2003 | Goetz et al. | |
| 6,740,959 B2 | 5/2004 | Alcoe et al. | |
| 6,838,739 B2 | 1/2005 | Stelzl et al. | |
| 7,045,385 B2 | 5/2006 | Kim et al. | |
| 7,094,626 B2 | 8/2006 | Stelzl et al. | |
| 7,102,224 B2 * | 9/2006 | Pahl | H03H 9/059 |
| | | | 257/E23.128 |
| 7,239,023 B2 | 7/2007 | Yu-Tung et al. | |
| 7,239,068 B2 | 7/2007 | Miyaji | |
| 7,259,041 B2 | 8/2007 | Stelzl et al. | |
| 7,552,532 B2 | 6/2009 | Stelzl et al. | |
| 8,319,322 B2 | 11/2012 | Toda et al. | |
| 8,404,516 B2 | 3/2013 | Bauer et al. | |
| 8,674,498 B2 | 3/2014 | Feiertag et al. | |
| 9,023,442 B2 | 5/2015 | Gruenwald | |
| 10,859,457 B2 * | 12/2020 | Leuschner | G01L 9/0073 |
| 2001/0009277 A1 | 7/2001 | Gaynes et al. | |
| 2002/0027296 A1 * | 3/2002 | Badehi | B81C 1/00301 |
| | | | 257/782 |
| 2005/0121785 A1 | 6/2005 | Stelzl et al. | |
| 2006/0151203 A1 | 7/2006 | Krueger et al. | |
| 2006/0267178 A1 * | 11/2006 | Metzger | H03H 9/0523 |
| | | | 257/698 |
| 2008/0048317 A1 | 2/2008 | Krueger et al. | |
| 2009/0071710 A1 | 3/2009 | Stelzl et al. | |
| 2010/0127377 A1 | 5/2010 | Bauer et al. | |
| 2013/0130493 A1 | 5/2013 | Kuratani et al. | |
| 2014/0111062 A1 | 4/2014 | Bauer et al. | |
| 2021/0017017 A1 * | 1/2021 | Gudeman | B81B 3/0035 |

FOREIGN PATENT DOCUMENTS

| | | |
|---|---|---|
| DE | 10253163 | 7/2015 |
| EP | 1055285 A1 | 11/2000 |
| EP | 1640775 A1 | 3/2006 |
| JP | H11150440 A | 6/1999 |
| WO | 1997045955 | 12/1997 |
| WO | 1999043084 A1 | 8/1999 |
| WO | 2003032484 A1 | 4/2003 |
| WO | 2014187505 A1 | 11/2014 |
| WO | 2017108265 A1 | 6/2017 |

* cited by examiner

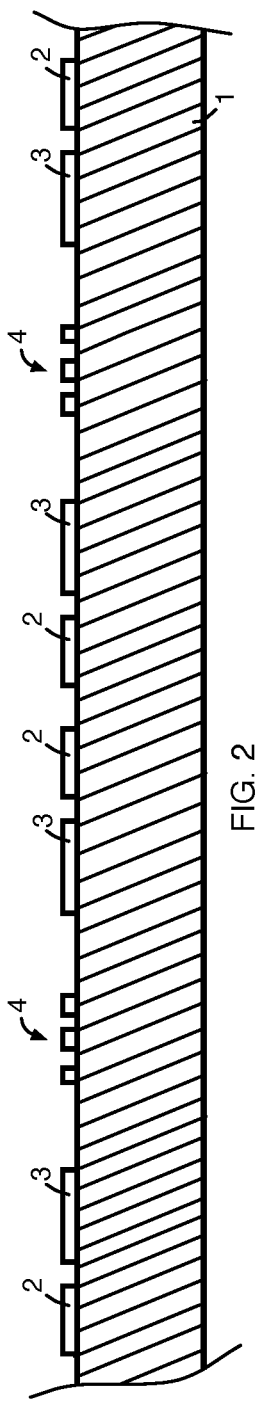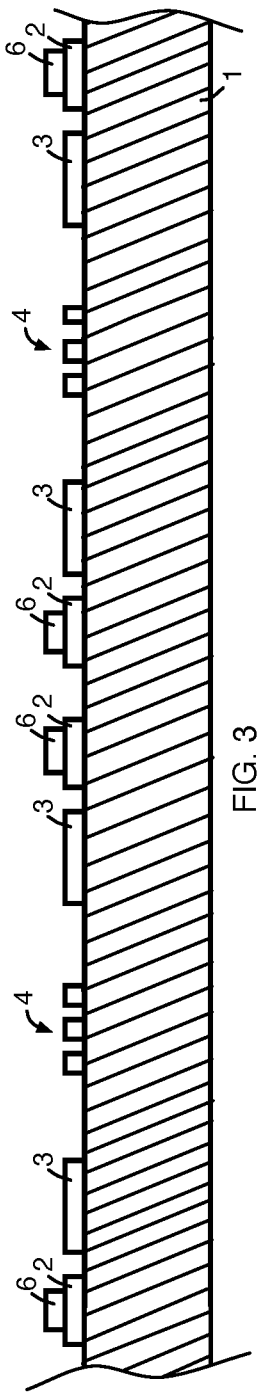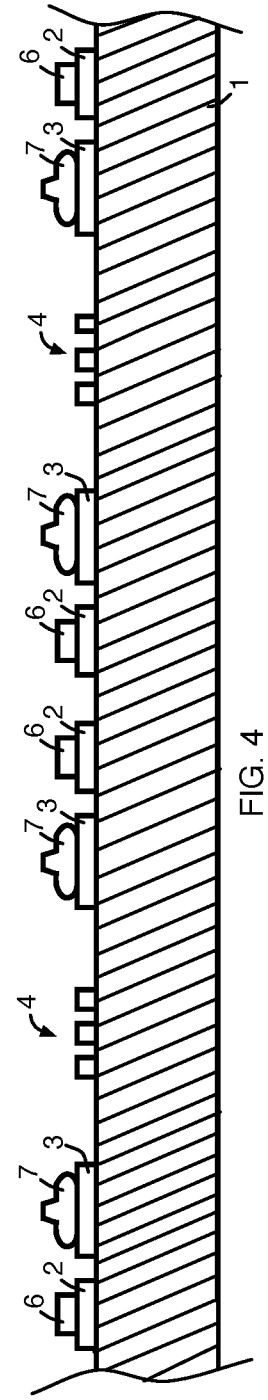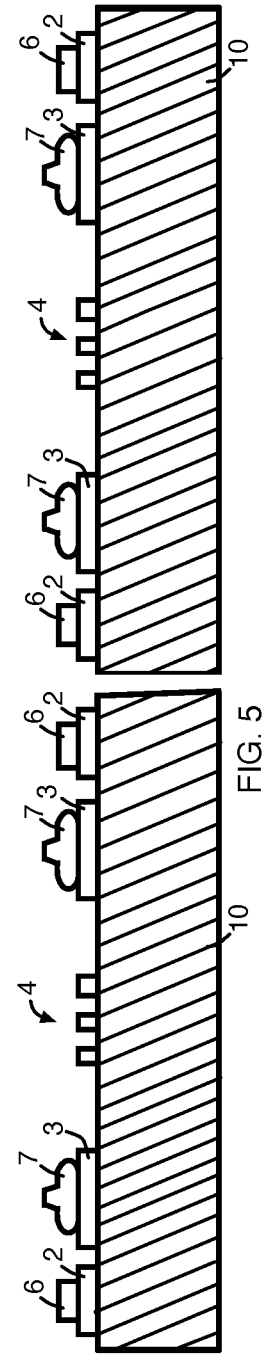

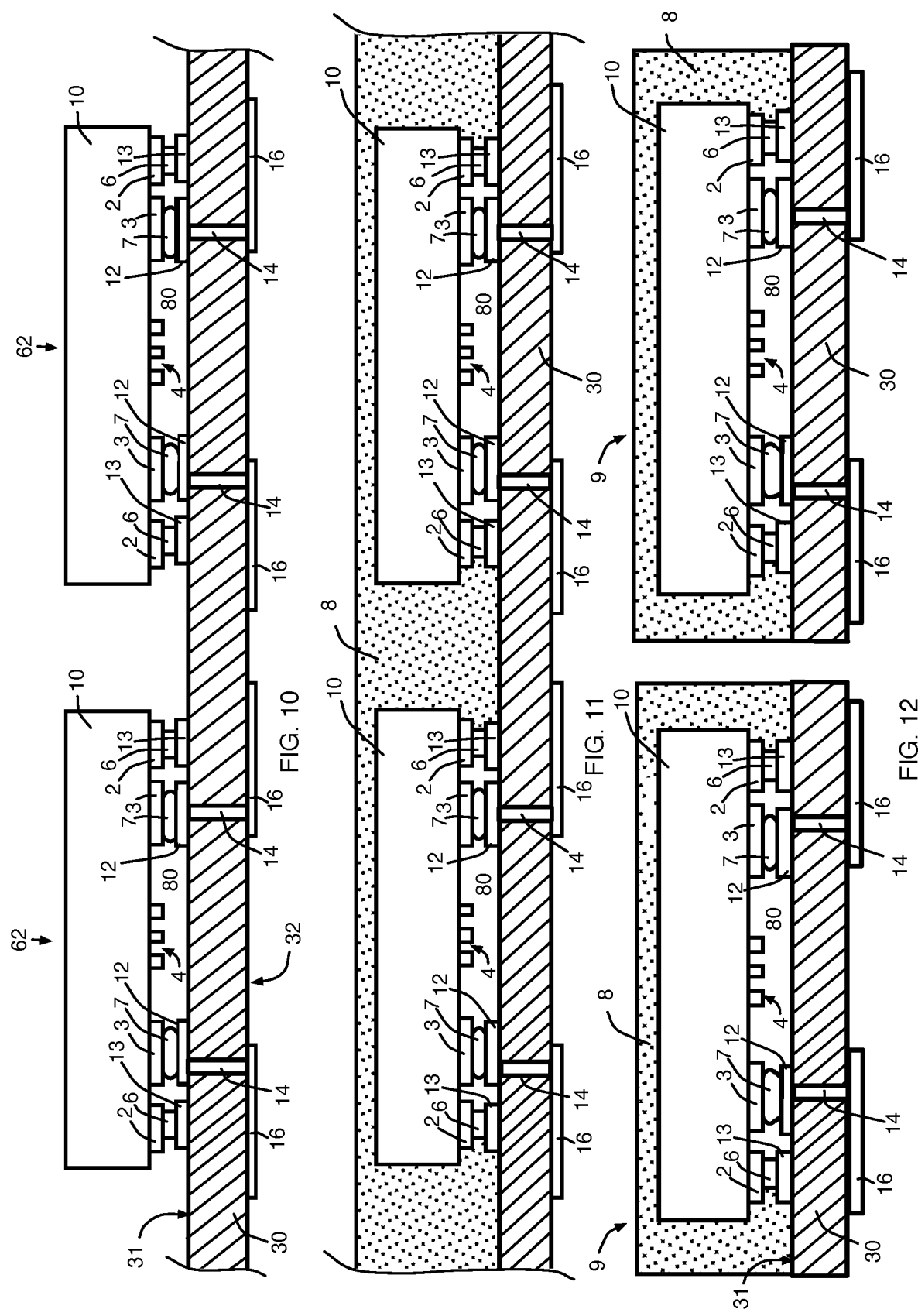

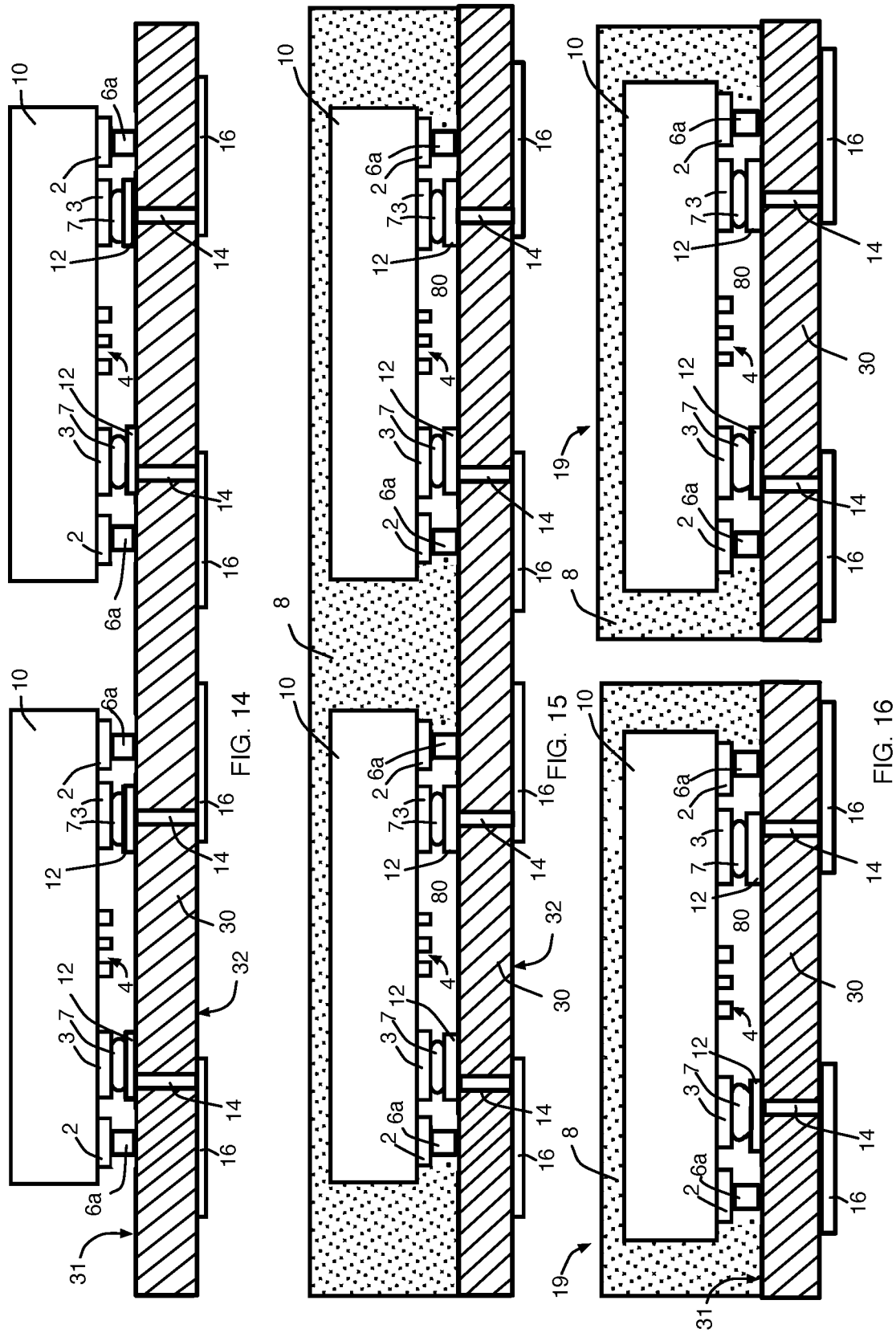

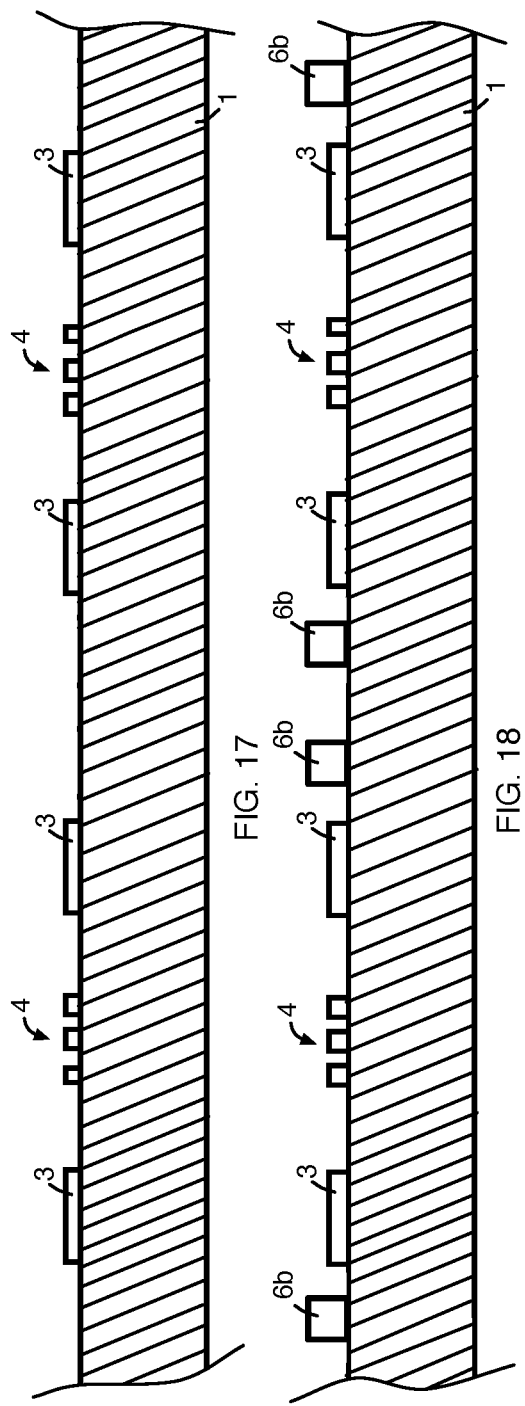

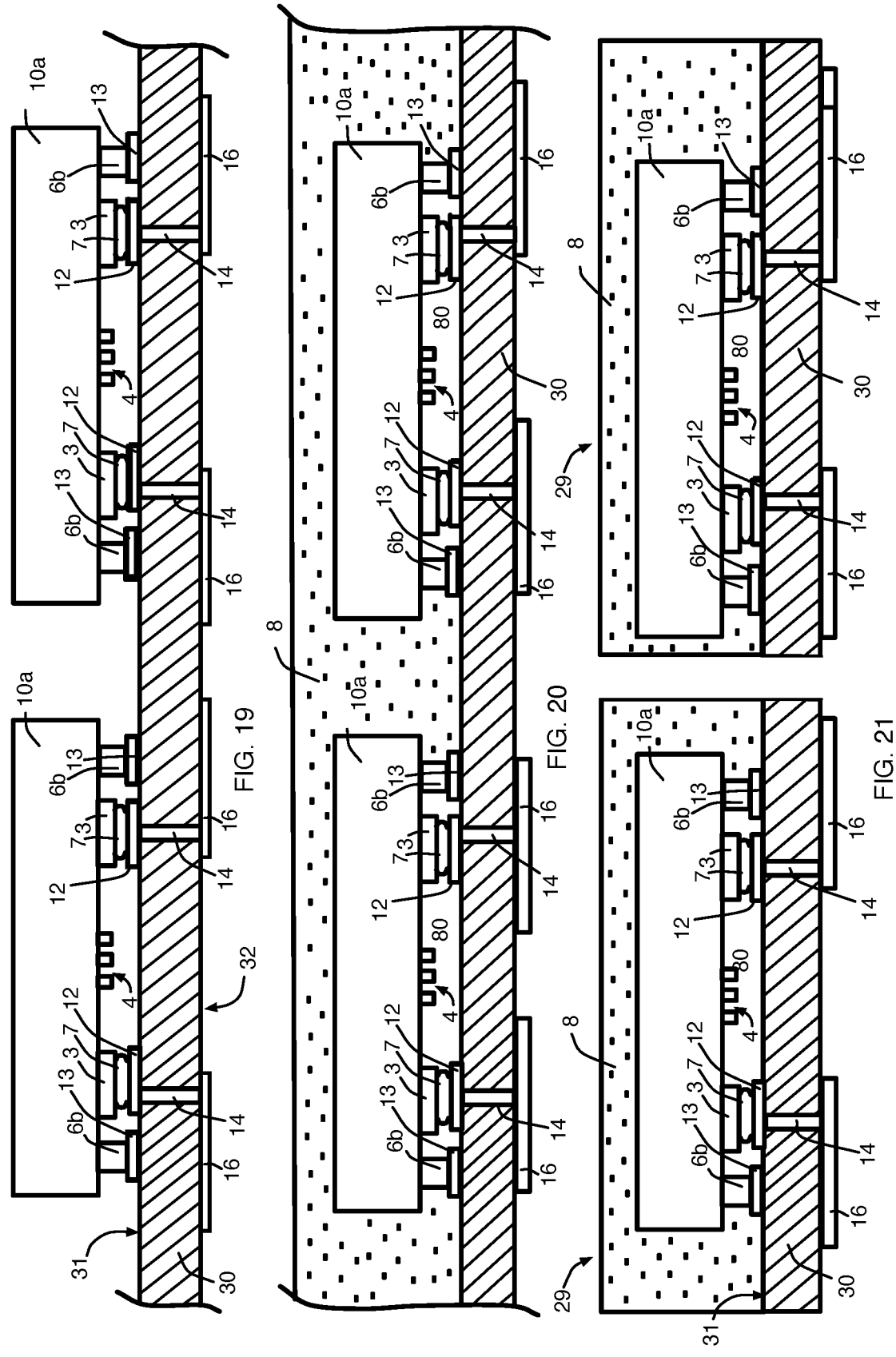

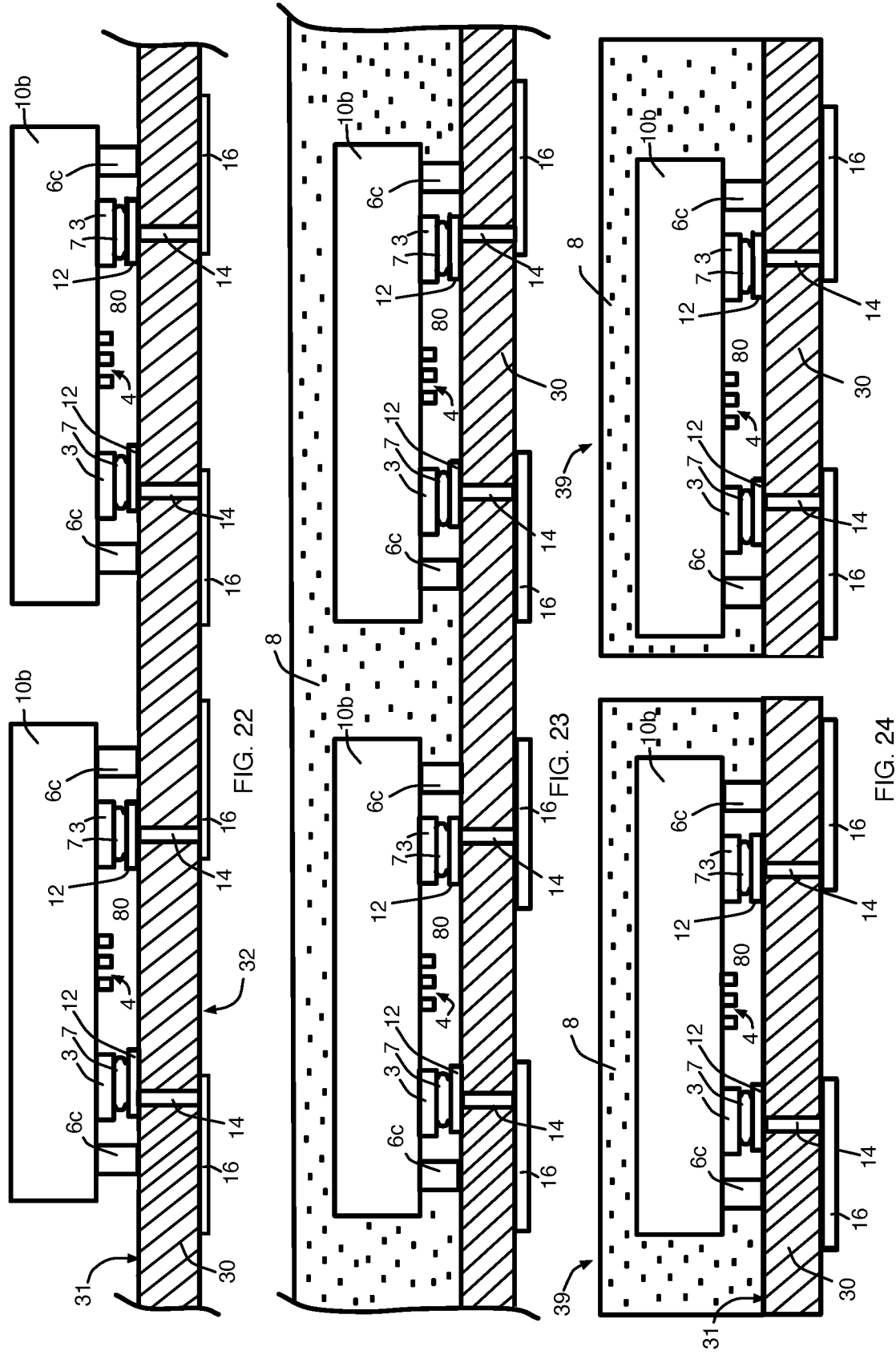

METHOD FOR FORMING PACKAGED SEMICONDUCTOR DIE WITH MICRO-CAVITY

REFERENCE TO RELATED APPLICATIONS

The present application claims priority to U.S. Provisional Patent Application Ser. No. 62/913,129, filed on Oct. 9, 2019 and is a divisional of U.S. Non-Provisional patent application Ser. No. 16/816,010, filed on Mar. 11, 2020, the contents of each of which are incorporated by reference in their entirety.

BACKGROUND

Surface Acoustic Wave (SAW) components require packaging that leaves the surface of the SAW device thereof uncovered and keeps the surface of the SAW device clean and dry. Otherwise the micro-acoustic wave would be attenuated. Accordingly, SAW components typically include sealed cavities that leave the SAW device(s) internally exposed. Micro Electrical Mechanical Systems (MEMS) and Bulk Acoustic Wave (BAW) components also require an internal sealed cavity for the respective devices thereon.

Conventional processes for forming packages for SAW, BAW or MEMS components having internal sealed cavities apply a glob-top sealing material to the carrier substrate, with sealing structures on the substrate side such as solder rings (e.g., Au/Sn solder rings), protective foils, buffer layers at the chip edges or metal shielding used to prevent the glob-top sealing material from entering the cavity. One problem with these conventional processes is that the glob-top material can enter into the cavity, damaging the SAW, MEMS or BAW device. Also, conventional processes that use solder rings, protective foils, buffer layers at the chip edges and metal shielding are expensive.

Accordingly, there is a need for a method and apparatus that will provide for good sealing of a device requiring a sealed cavity at reduced cost.

BRIEF DESCRIPTION

An apparatus is disclosed that includes a substrate; an electronic die having a device formed thereon; a photoresist frame secured to the electronic die and extending completely around the device. The photoresist frame is secured to a first major surface of the substrate so as to form an enclosure around the device. The apparatus further includes encapsulant material that extends over the electronic die and around the sides of the electronic die such that the encapsulant material is in contact with the first major surface of the substrate around the entire periphery of the electronic die so as to form a seal around the electronic die.

A method for forming a packaged electronic die using a substrate and a device wafer is disclosed. The method includes depositing a first metal layer over the device wafer; forming a plurality of bonding pads on the device wafer; depositing a photoresist layer over the device wafer; patterning the photoresist layer so as to form a photoresist frame that completely surrounds the device; depositing conductive balls over the bonding pads; cutting the wafer to form the electronic die; and placing the electronic die over the substrate. The method further includes heating and compressing the conductive balls so as to couple each conductive ball to one of the bonding pads on the die and to the substrate, the heating and compressing moving the electronic die closer to the substrate such that the photoresist frame is in direct contact with the substrate or with a landing pad formed on the substrate; depositing a encapsulant material such that the encapsulant material covers the electronic die and the substrate; curing the encapsulant material so as to encapsulate the electronic die; and cutting the substrate to separate the packaged electronic die.

The method and apparatus of the present invention produce a micro-cavity that leaves the device exposed within the cavity. The encapsulant material assures that the micro-cavity is sealed, protecting the device from moisture and contaminants. Because the method and apparatus of the present invention does not require solder rings, protective foils, buffer layers at the chip edges or metal shielding, in many instances it is less expensive than prior art processes. In addition, the photoresist frame is effective at sealing off the micro-cavity, thus preventing or reducing intrusion of glob-top material into the cavity.

BRIEF DESCRIPTION OF THE DRAWING FIGURES

The invention will be explained in more detail in the following with reference to examples and to the drawing in which are shown. It is appreciated that the drawings are not drawn to scale.

FIG. 2 is a diagram showing a cross-sectional view of a portion of a device wafer after a metal layer has been deposited and patterned to form bonding pads and a metal region that extends completely around a device, in accordance with an example of the invention.

FIG. 3 is a diagram showing a cross-sectional view of the portion of the device wafer shown in FIG. 2 after a photoresist layer has been deposited and patterned to form a photoresist frame that overlies the metal region and that completely surrounds the device, in accordance with an example of the invention.

FIG. 4 is a diagram showing a cross-sectional view of the portion of the device wafer shown in FIG. 3 after conductive balls have been deposited over the bonding pads in accordance with an example of the invention.

FIG. 5 is a diagram showing a cross-sectional view of the portion of the device wafer shown in FIG. 4 after the wafer has been cut to form individual die, in accordance with an example of the invention.

FIG. 10 is a diagram showing a side cross-sectional view of the substrate assembly of FIG. 9 in accordance with an example of the present invention.

FIG. 11 is a diagram showing a side cross-sectional view of the substrate assembly of FIG. 10 after a glob-top encapsulant material has been deposited, in accordance with an example of the present invention.

FIG. 12 is a diagram showing side cross-sectional view of the substrate assembly of FIG. 11 after a dicing process has been performed to separate individual packaged electronic dies, in accordance with an example of the present invention.

FIG. 14 is a diagram showing a side cross-sectional view illustrating the method of FIG. 1, where a landing pad is not formed on the substrate, in accordance with an example of the present invention.

FIG. 15 is a diagram showing a side cross-sectional view of the substrate assembly of FIG. 14 after a encapsulant material has been deposited, in accordance with an example of the present invention.

FIG. 16 is a diagram showing a side cross-sectional view of the substrate assembly of FIG. 15 after a dicing process has been performed to separate individual packaged electronic dies, in accordance with an example of the present invention.

FIG. 17 is a diagram showing a cross-sectional view of a portion of a device wafer after a metal layer has been deposited and patterned to form bonding pads in accordance with an example of the invention.

FIG. 18 is a diagram showing a cross-sectional view of the portion of the device wafer shown in FIG. 17 after a photoresist layer has been deposited and patterned to form a photoresist frame that completely surrounds the device, in accordance with an example of the invention.

FIG. 19 is a diagram showing a side cross-sectional view of a substrate assembly, in accordance with an example of the present invention.

FIG. 20 is a diagram showing a side cross-sectional view of the substrate assembly of FIG. 19 after a encapsulant material has been deposited, in accordance with an example of the present invention.

FIG. 21 is a diagram showing a side cross-sectional view of the substrate assembly of FIG. 20 after a dicing process has been performed to separate individual packaged electronic dies, in accordance with an example of the present invention.

FIG. 22 is a diagram showing a side cross-sectional view of a substrate assembly produced according to a portion of the method of FIG. 1, in accordance with an example of the present invention.

FIG. 23 is a diagram showing a side cross-sectional view of the substrate assembly of FIG. 22 after a encapsulant material has been deposited, in accordance with an example of the present invention.

FIG. 24 is a diagram showing a side cross-sectional view of the substrate assembly of FIG. 23 after a dicing process has been performed to separate individual packaged electronic dies, in accordance with an example of the present invention.

DETAILED DESCRIPTION

Persons of ordinary skill in the art will realize that the following description is illustrative only and not in any way limiting. Other examples will readily suggest themselves to such skilled persons.

Figure 1:
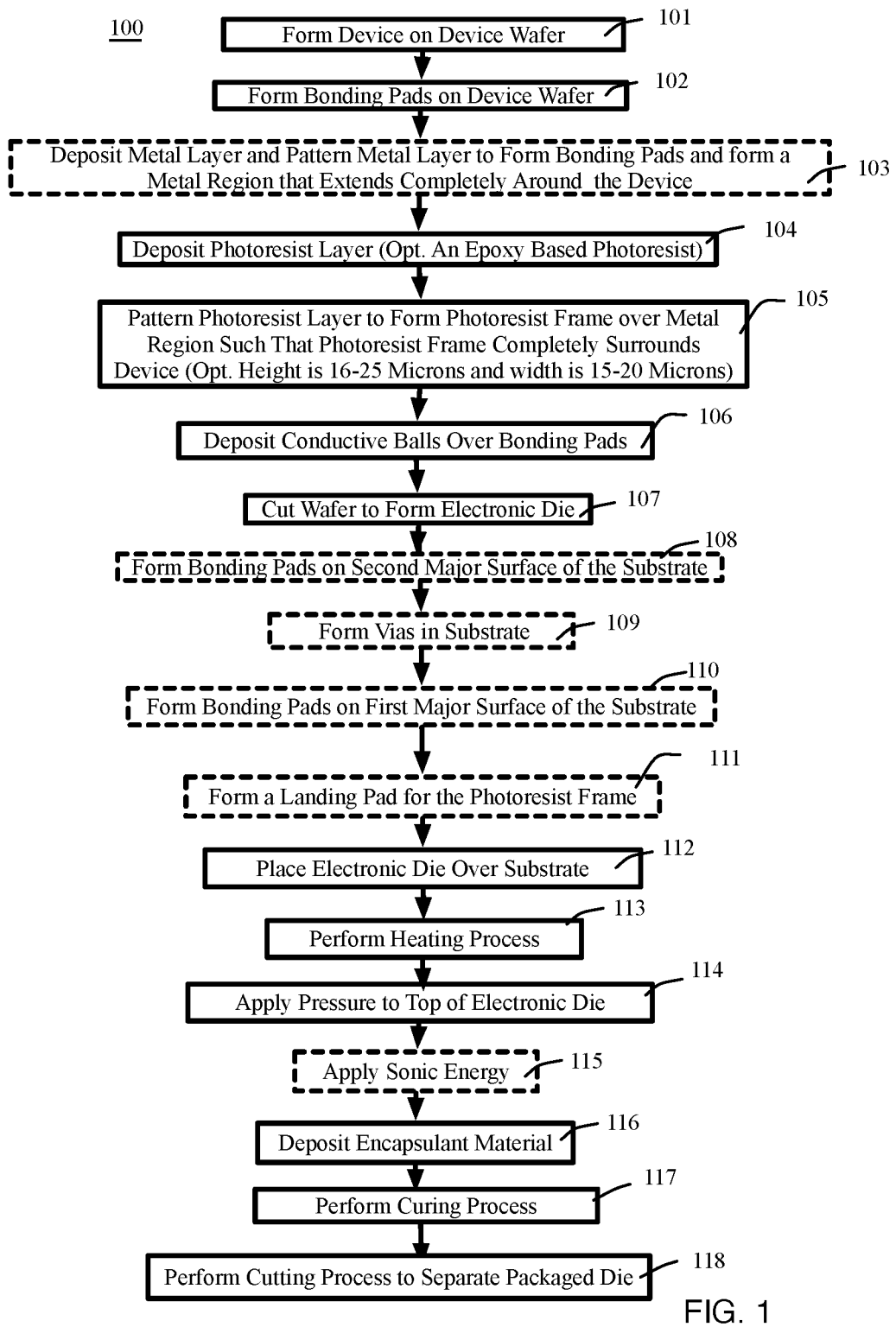
FIG. 1 is a block diagram showing a method for forming a packaged electronic die having a micro-cavity in accordance with an example of the invention.

FIG. 1 shows a method 100 for forming a packaged die. A device is formed (101) on a device wafer. Bonding pads are formed (102) on the device wafer. Optionally, a first metal layer is deposited over the device wafer and is patterned (103) to form a first metal region that extends completely around the device. In one example, a first portion of the patterned first metal layer forms a plurality of bonding pads and a second portion of the patterned first metal layer forms the first metal region that extends completely around the device. The patterning of step 103 may include depositing a photoresist, exposing the photoresist in the desired pattern, one or more bake steps, photoresist strip, an etch to remove the portion of the metal layer not overlain by the photoresist and a resist stripping process.

In the example shown in FIG. 2, a device wafer 1 is shown that has a device 4 formed thereon. Steps 102-103 pattern a metal layer to form bonding pads 3 and first metal region 2 that extends completely around device 4. Bonding pads 3 are electrically coupled to device 4 for providing input and output to device 4. First metal region 2 extends completely around both device 4 and bonding pads 3.

In the present example the metal layer is aluminum or an aluminum alloy. However, alternatively, bonding pads 3 and/or first metal region 2 could be copper or a copper alloy, gold or a gold alloy, or other metals.

A photoresist layer is deposited (104) over the device wafer. The photoresist layer is patterned (105) so that a photoresist frame is formed that overlies the first metal region 2 and completely surrounds the device 4.

The photoresist layer may be constituted of any photoresist that allows for forming thick, high-aspect ratio structures (e.g., structures with a 15-20 micron width and a 16-25 micron height) that have high durability. In the present non-limiting example the photoresist is an epoxy-based photoresist such as an SU-8 photoresist (e.g. SU-8 3000) manufactured by Kayaku Microchem and available through Microchem Corp, Westborough, Mass. In this non-limiting example the photoresist layer is deposited by spin coat process, followed by a soft bake (at 100° C.), an exposure through a photomask, a post-exposure bake (65° C. for 1 min and 95° C.), followed by a development process step (e.g., immersion, spray or spray-puddle with MicroChem SU-8 developer, ethyl lactate or diacetone alcohol) with a final hard bake at 150° C. for 1 hour.

In the example shown in FIG. 3, steps 104-105 form photoresist frame 6 that directly overlies and is directly attached to metal region 2 that overlies device wafer 1. It can be seen that photoresist frame 6 extends completely around device 4 and bonding pads 3. The bottom surface of photoresist frame 6 is in direct contact with metal region 2.

Conductive balls are deposited (106) over the bonding pads. The term "bonding pad," as used in the present invention, includes not only rectangular or circular pads designated specifically for bonding, but can also include larger structures having different shapes, as long as a portion of such structures are designed to receive a conductive ball for connection to other structures.

In the example shown in FIG. 4, step 106 deposits conductive balls 7 over each bonding pad 3 on device wafer 1. Conductive balls 7 couple to device 4 and are surrounded by metal region 2 and photoresist frame 6. The conductive balls 7 may be gold or gold alloy and may be deposited using a stud-bumping process. In one example a gold stud-bumping process is used to form gold conductive balls 7. Alternatively, traditional solder material (e.g., Sn—Pb), lead-free solder (e.g., Sn—Cu, Sn—Ag—Cu, Au—Sn), conductive epoxy, copper or other conductive material may be used to form conductive balls 7. In yet another example conductive balls 7 are each a conventional solder ball deposited using a conventional solder-bumping process.

The device wafer is then cut (107) to form individual electronic die. FIG. 5 shows device wafer 1 of FIG. 4 that has been cut to form individual die 10. Each electronic die 10 includes bonding pads 3, device 4, metal region 2, photoresist frame 6 and conductive balls 7.

Figure 6:
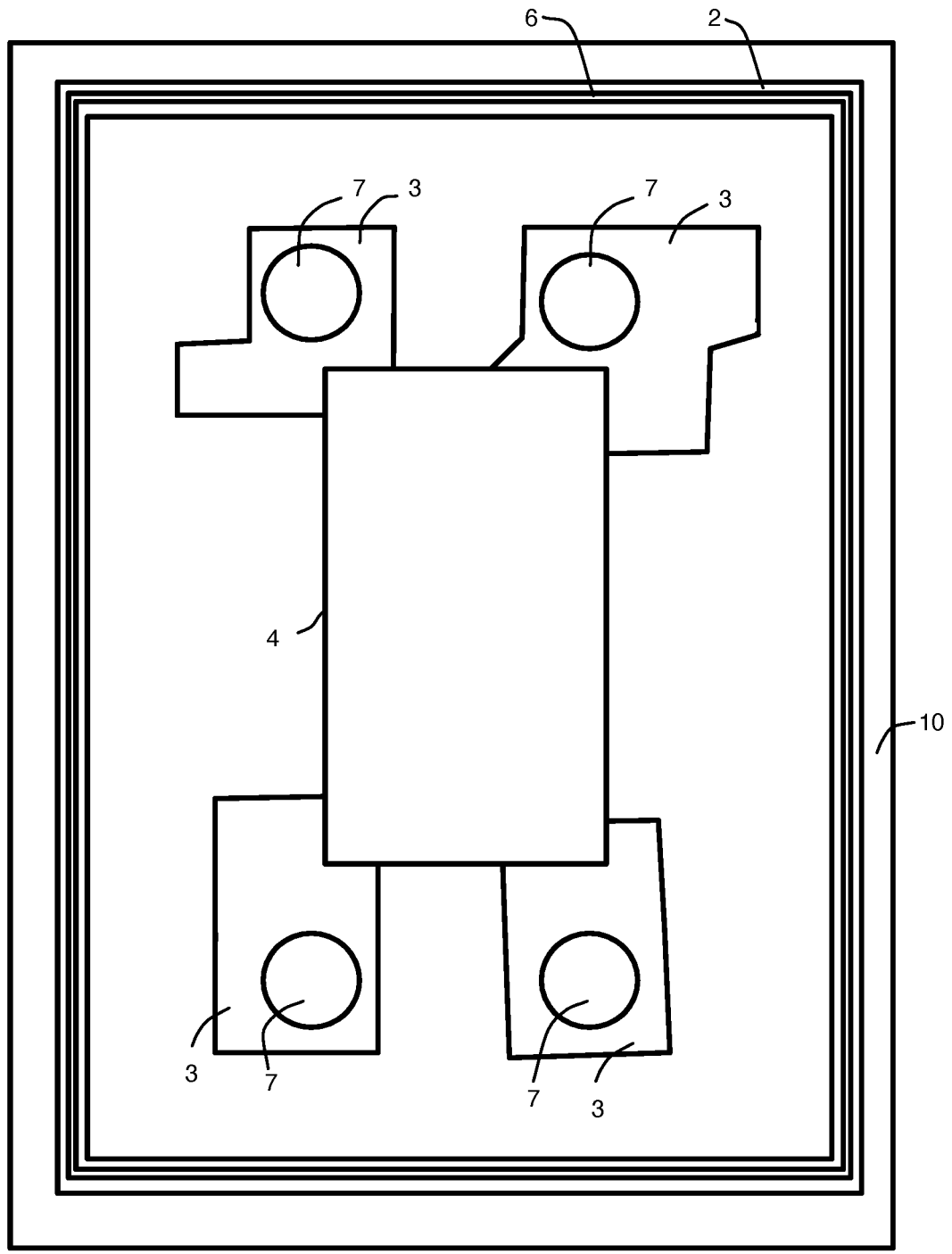
FIG. 6 is a diagram showing a top view of an electronic die in accordance with an example of the invention.

FIG. 6 shows a top view of an exemplary electronic die 10 after steps 101-107 have been performed. First metal region 2 extends completely around the device 4 and bonding pads 3; and has a width, i.e. a lateral thickness of constituent portions thereof, that is equal or greater than the width of photoresist frame 6 along the entire portion of metal region 2 that is overlain by photoresist 6. The width of first metal region 2 and the width of photoresist 6 may be kept to a minimum so as to maximize the surface area available for device 4 or to increase the number of electronic die 10 which can be formed from each device wafer 1.

Photoresist frame 6 may have a 15-20 micron width and a 16-25 micron height. In one example conductive ball 7 is reduced to a thickness of approximately 16 microns in the heating process, photoresist frame 6 has a thickness of 16 microns, first metal region 2 and bonding pad 3 have a thickness of 1 micron and second metal region 13 as well as bond pad 12 a thickness of 8 microns, giving a micro-cavity with an exemplary height of 25 microns.

Device 4 may be any type of semiconductor, electronic or mechanical device that requires an open cavity to operate effectively, and may be a MEMS device (e.g., a MEMS switch, a MEMS sensor, or a MEMS oscillator), a SAW device or a BAW device.

Optionally, bonding pads are formed (108) on a substrate by depositing a metal layer on a second major surface of the substrate (e.g., a "bottom surface" of the substrate) and patterning the metal layer (e.g. by thick-film printing or by depositing a photoresist, exposing the resist in the desired pattern, one or more bake step, photoresist strip, an etch to remove the portion of the metal layer not overlain by photoresist, and a resist stripping process).

Optionally, vias are formed (109) in the substrate by creating openings that extend through the substrate (e.g. by depositing a photoresist, exposing the resist in the desired pattern, one or more bake step, photoresist strip, an etch to form the openings, and a resist stripping process) and then filling the openings with conductive material such as, for example, metal.

Optionally 110 bonding pads are formed on a first major surface of the substrate (e.g., a "top surface" of the substrate). Optionally, a landing pad for the photoresist frame is formed (111) on the first major surface of the substrate. In one example one or more metal layer is deposited on the substrate and is patterned to form a second metal region that forms the landing pad for the photoresist frame and a third metal region that comprises the bonding pads. In one example the one or more metal layer is formed by printing a layer of tungsten on the substrate, followed by nickel and gold plating, forming a three-layer metal region that includes a tungsten layer overlain by a nickel layer that is overlain by a gold layer. The patterning may include printing processes or depositing a photoresist, exposing the resist in the desired pattern, one or more bake step, photoresist strip, an etch to remove the portion of the metal layer not overlain by photoresist, and resist stripping.

Figure 7:
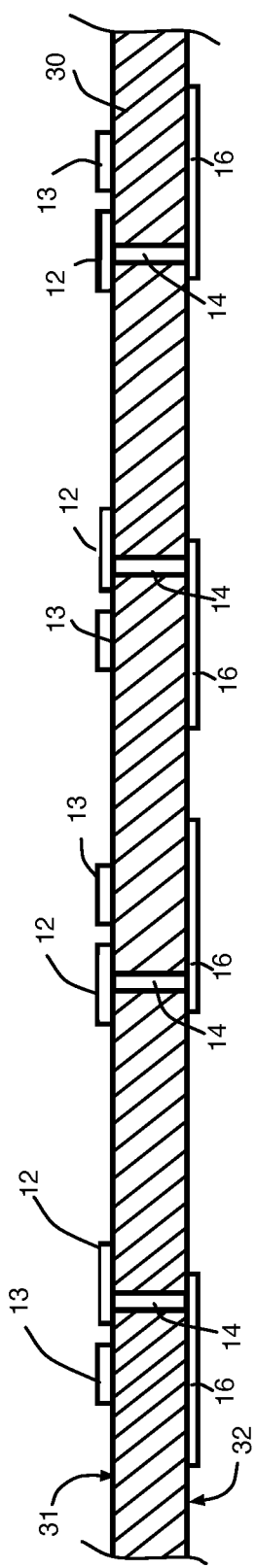
FIG. 7 is a diagram showing a side cross-sectional view of a substrate assembly in accordance with an example of the present invention.
Figure 8:
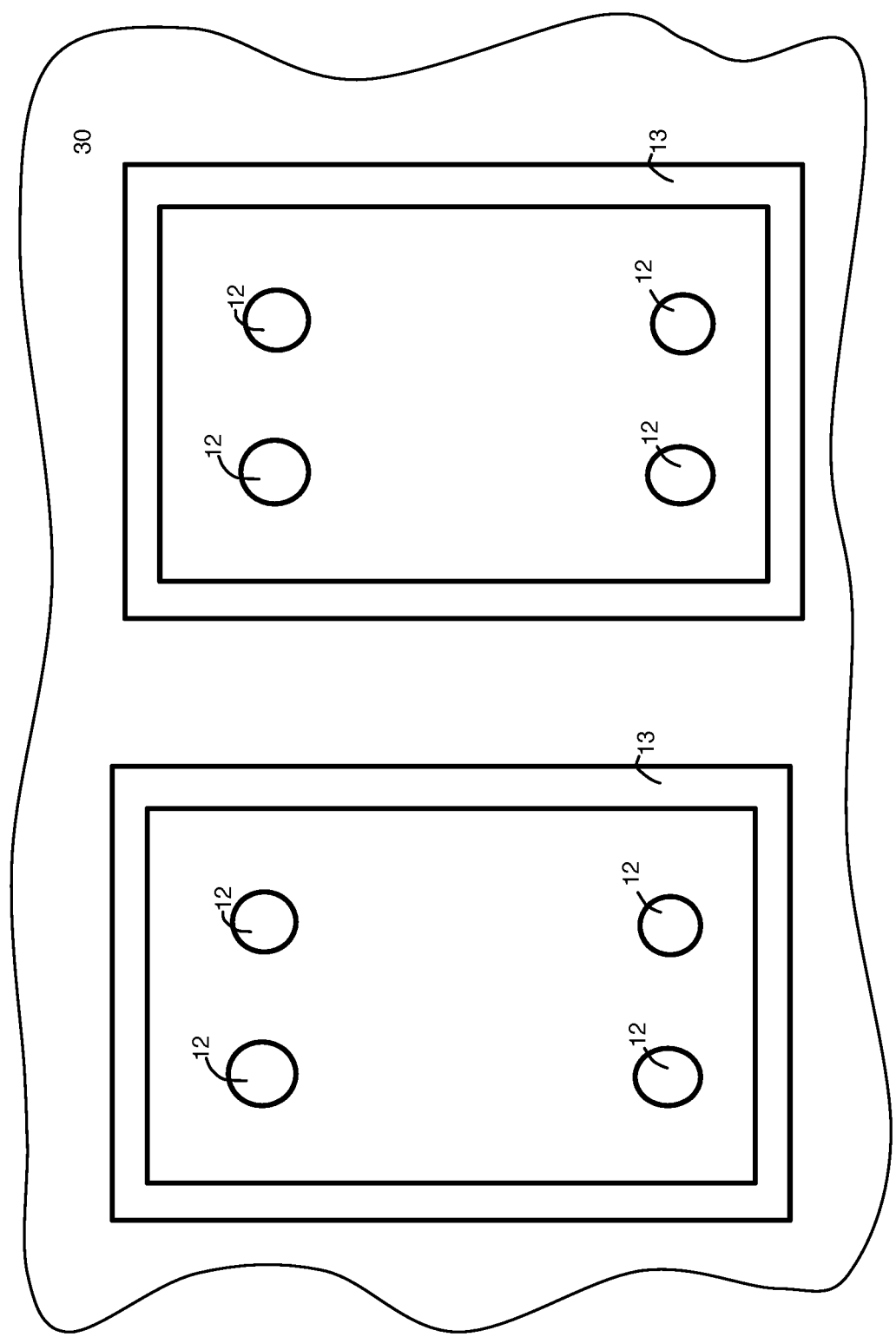
FIG. 8 is a diagram showing a top view of the substrate assembly of FIG. 7, in accordance with an example of the present invention.

FIGS. 7-8 show an exemplary substrate assembly after steps 108-111 have formed bonding pads 12 on the first major surface 31 of substrate 30, bonding pads 16 on the second major surface 32 of the substrate 30 and vias 14 that electrically couple to bonding pads 16 and to bonding pads 12 for electrically coupling bonding pads 12 to bonding pads 16. Substrate 30 may be ceramic. Alternatively, substrate 30 may be a circuit board. Steps 110-111 form second metal region 13 that forms a landing pad for the photoresist frame 6. As shown in FIG. 8, second metal region 13 extends outside of bonding pads 12 and extends completely around bonding pads 12. In this example second metal region 13 has a shape that corresponds to the shape of photoresist frame 6.

Figure 9:
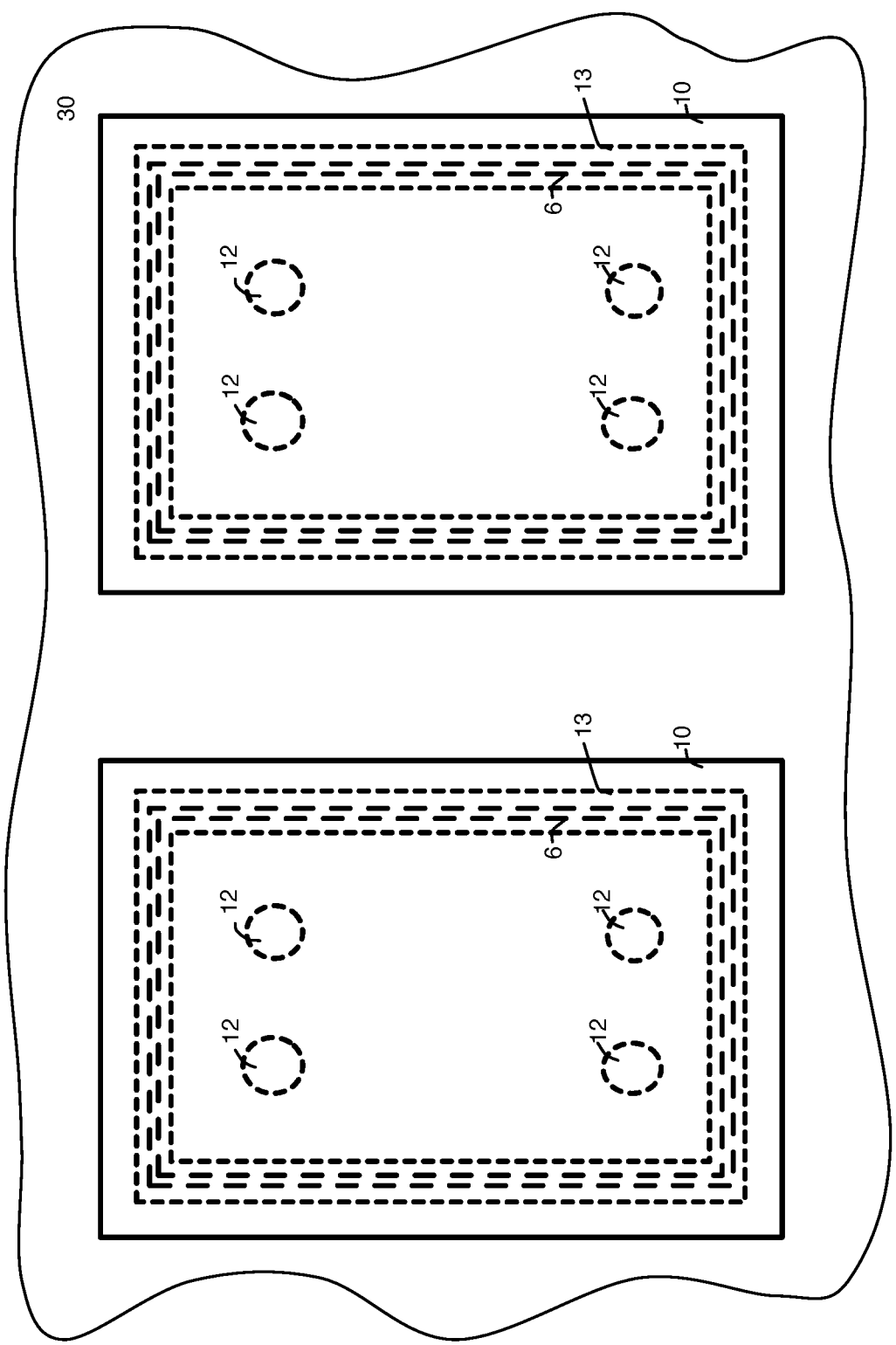
FIG. 9 is a diagram showing a top view of the substrate assembly of FIGS. 7-8, after the electronic die has been placed over the substrate and after a bonding process has been performed to bond the die to the substrate in accordance with an example of the present invention.

The electronic die is placed over the substrate (112). FIG. 9 shows the placement of electronic die 10 over substrate 30, and illustrates the location of photoresist frame 6 with respect to second metal region 13. Second metal region 13 has a lateral extent that is greater than the lateral extent of photoresist frame 6 such that the full lateral extent of photoresist frame 6 extends within the lateral extent of second metal region 13.

A heating process step is performed (113) to heat the conductive balls 7 and pressure is applied (114) to the back side of the electronic die 10. Optionally, sonic energy is applied (115) so as to perform a thermo-sonic bonding process. The applied pressure, illustrated by arrow 62 of FIG. 10 combined with the heat and optionally the thermo-sonic energy bonds each conductive ball 7 to one of the respective bonding pads 12, the heating causing the conductive ball 7 to reflow or plastically deform (e.g., when ultra-sonic energy is applied), moving the electronic die 10 closer to the substrate 30 such that the photoresist frame 6 is in direct contact with second metal region 13. The temperature achieved by the applied heat, pressure and optional thermo-sonic energy is a function of the material used in conductive ball 7. When conductive ball 7 is gold, a temperature of 190 degrees Centigrade can be used. In one example, steps 113-114, and optional step 115, cause the thickness of conductive balls 7 to decreases to approximately 16 microns.

In one example the bonding process of steps 113-115 is a thermo-sonic bonding process that uses a force of 90 g/bump, a temperature of 190° C. and an ultra-sonic power maximum of 0.5 Watts.

FIG. 10 shows a side cross-sectional view of the substrate assembly after steps 112-115 have been performed to electrically and physically couple electronic die 10 to substrate 30 through conductive balls 7, forming a micro-cavity 80 that allows for device 4 to be exposed within micro-cavity 80. In the present example photoresist frame 6 directly overlies second metal region 13 and directly contacts second metal region 13 along the entire length and breadth of photoresist frame 6. As described above, photoresist frame 6 is in direct contact with the metal region 2, and completely surrounds the device 4, bonding pads 3 and bonding pads 12.

A encapsulant material is deposited (116) such that the encapsulant material covers the substrate 30 and the bonded electronic die 10. The encapsulant material is then cured (117) so as to form a seal around the electronic die 10, encapsulating the electronic die 10. The encapsulant material may be a plant or synthetic insulating resin that gives protection against external agents such as moisture and dust. Preferably, a solvent-free resin with high ionic purity (e.g., a Cl content of less than 10 ppm) is used such as, for example PROTAVIC PNE 30270, manufactured by Protavic International of Paris, France, which may be cured at a temperature of 125 to 175 degrees Centigrade for a time period of 1-30 minutes. The curing process may include a second heating process (post-curing) for 1 hour at 150 degrees Centigrade. FIG. 11 shows a side cross-sectional view of the substrate assembly of FIG. 10 after the encapsulant material 8 has been deposited. Such a encapsulant material is also known as a glob-top.

A cutting process is performed (118) to cut the substrate assembly so as to separate the packaged dies. The cutting process may be by rotary cutting blade or laser, and severs the substrate 30 and the encapsulant material around each die 10, leaving enough space around each die 10 such that the seal is maintained around the die 10.

FIG. 12 shows the packaged electronic die 9 formed in accordance with method 100. Encapsulant material 8 extends over electronic die 10, around the sides of electronic die 10 and is in contact with the first major surface 31 of substrate 30 around the entire periphery of electronic die 10. Micro-cavity 80 extends between the substrate 30 and an active surface of electronic die 10. Micro-cavity 80 has sides that include photoresist frame 6, first metal region 2 and landing pad 13. As described above, photoresist frame 6 completely surrounds device 4, conductive balls 7, bonding pads 3 and bonding pads 12. Device 4 couples to one or more of bonding pads 16 through vias 14.

Figure 13:
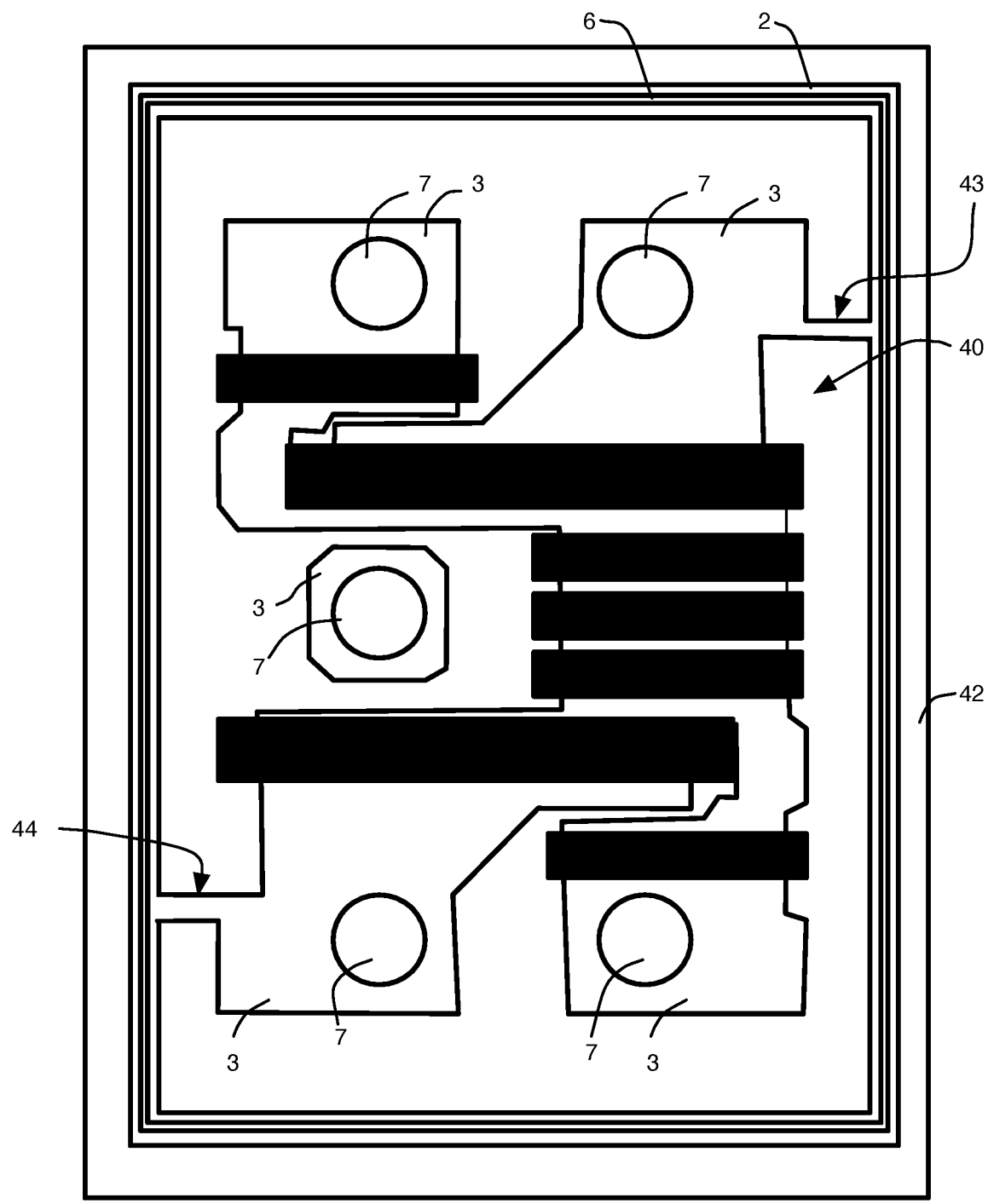
FIG. 13 is a diagram showing a top view of an electronic die, and illustrates an example in which the device is a SAW device in accordance with an example of the invention.

FIG. 13 shows an example in which the packaged electronic die is a SAW filter 40 formed on a piezoelectric wafer 42 such as a LiTaO, or LiNbO, wafer. In the example shown in FIG. 13, patterning step 103 forms first metal region 2 that is in electrical contact with a portion of the metal layer that forms bonding pad 3 (e.g., at regions 43-44 for grounding metal region 2). As described above, photoresist frame 6 completely surrounds SAW Filter 40 and conductive balls 7.

Though FIGS. 7-13 show a substrate assembly where substrate 30 exhibits a single layer and vias 14 that extend through the entire thickness of substrate 30 to couple each bonding pad 12 to a single bonding pad 16, it is appreciated that substrate 30 may include multiple layers and that bonding pads 12 may be coupled to more than one bonding pad 16. In one alternate example substrate 30 is a circuit board having multiple layers, with vias 14 extending between circuit board layers so as to couple each bonding pad 12 with one or more bonding pad 16, or with other connection points on or within the circuit board.

FIGS. 14-16 illustrate an example in which a landing pad is not formed on the substrate in step 111. FIG. 14 shows a substrate assembly in which steps 101-107 have formed an electronic die 10 having bonding pads 3, conductive balls 7, first metal region 2 that extends completely around device 4, and photoresist frame 6a that extends completely around device 4; steps 108-110 have formed bonding pads 12 on first major surface 31 of substrate 30, vias 14 and bonding pads 16 on second major surface 32 of substrate 30; and after the electronic die 10 has been placed (112) over the substrate 30. When the bonding process of steps 113-115 is performed conductive ball 7 will melt or be plastically deformed and the electronic die 10 will move toward substrate 30, with photoresist frame 6a contacting the first major surface 31 of substrate 30. Thereby, each conductive ball 7 will be in contact with one of the bonding pads 3 and one of the bonding pads 12. Photoresist frame 6a will be in direct contact with first major surface 31 of the substrate 30 along the entire length and breadth of photoresist frame 6a so as to form an enclosure around device 4.

Photoresist frame 6a needs to have sufficient height such that, when the bonding process of steps 113-115 is performed, photoresist frame 6a will come into contact with first major surface 31. Accordingly, the photoresist frame 6a may have a greater thickness than photoresist frame 6 shown in FIGS. 2-6 and 9-13.

Photoresist frame 6a may have a 15-20 micron width and a 16-25 micron height. In one example, conductive ball 7 is reduced to a thickness of approximately 16 microns in the heating process, with a thickness of 1 micron for bonding pad 3 and 8 microns for bonding pad 12, photoresist frame 6a has a thickness of 24 microns and first metal region 2 has a thickness of 1 micron, giving a micro-cavity with a height of maximum 25 microns.

FIG. 15 shows the substrate assembly of FIG. 14 after encapsulant material 8 has been deposited (116). More particularly, encapsulant material 8 had been deposited over the substrate assembly that includes electronic die 10, device 4, bonding pads 3, conductive balls 7, first metal region 2, photoresist frame 6a, bonding pads 12 on first major surface 31 of substrate 30, vias 14 and bonding pads 16 on substrate 30.

FIG. 16 shows the substrate assembly of FIG. 15 after the cutting process of step 118 has been performed to form packaged electronic die 19 that includes electronic die 10, device 4, bonding pads 3, conductive balls 7, first metal region 2, photoresist frame 6a, bonding pads 12 on first major surface 31 of substrate 30, vias 14 and bonding pads 16 on substrate 30. It can be seen that encapsulant material 8 extends over electronic die 10, around the sides of electronic die 10 and is in contact with first major surface 31 of substrate 30 around the entire periphery of the electronic die 10 so as to form a seal around electronic die 10.

Packaged electronic die 19 includes a micro-cavity 80 that extends between substrate 30 and an active surface of electronic die 10. Packaged electronic die 19 includes electronic die 10, device 4, bonding pads 3, conductive balls 7, first metal region 2, photoresist frame 6a, bonding pads 12 on first major surface 31 of substrate 30, vias 14 and bonding pads 16 on substrate 30. Micro-cavity 80 has sides that include photoresist frame 6a and metal region 2. First metal region 2 of packaged electronic die 19 may have the shape shown in FIG. 6 or may have a shape that is in electrical contact with a portion of the metal layer that forms bonding pad 3 (e.g., for grounding metal region 2) as is shown in FIG. 13, and may be formed of aluminum, aluminum alloy or other conductive material.

Though the previous examples have discussed a single metal deposition and a single patterning process (103) such that bonding pads 3 and first metal region 2 are formed of the same material at the same time; alternatively, a first metal deposition and patterning process forms bonding pads 3 and a second metal deposition and patterning process forms metal region 2. In this example, a different material can be used in the first metal deposition than is used in the second deposition such that bonding pads 3 and first metal region 2 are formed of different materials and/or have different thicknesses.

FIGS. 17-21 illustrate an example in which the metal region (e.g., first metal region 2 of FIGS. 2-13 and 14-16) that extends around the device is not formed on the device wafer 1. FIG. 17 shows a cross-sectional view of an example in which devices 4 are formed on a device wafer 1 and in which a metal layer has been deposited and patterned to form bonding pads 3. FIG. 18 illustrates a cross-sectional view of the structure of FIG. 17 after steps 104-105 form photoresist frame 6b that completely surrounding bonding pads 3 and device 4. Photoresist frame 6b is in direct contact with the top surface of the device wafer 1 along the entire bottom surface of photoresist frame 6b.

FIG. 19 illustrates the structure of FIG. 18 after steps 101-102 and 104-107 have formed an electronic die 10a having bonding pads 3, photoresist frame 6b, and conductive balls 7; after steps 108-109 have formed bonding pads 12, bonding pads 16 and vias 14; after steps 110-111 have formed second metal region 13; and after the electronic die 10a has been placed (112) over the substrate 30. Second metal region 13 extends completely around bonding pads 12 and has a shape that is the same as photoresist frame 6 shown in FIG. 8. When the bonding process of steps 113-115 is performed conductive ball 7 will melt or be plastically deformed and the electronic die 10a will move toward substrate 30 such that photoresist frame 6b contacts second metal region 13. Preferably, photoresist frame 6b will be in direct contact with second metal region 13 along the entire length and breadth of photoresist frame 6b.

Photoresist frame 6b needs to have sufficient height such that, when the bonding process of steps 113-115 is performed, the photoresist frame 6b will come into contact with the second metal region 13. Accordingly, the photoresist frame 6b may have a greater thickness than photoresist frame 6 shown in FIGS. 2-13. In one example photoresist frame 6b may have a 15-20 micron width and a 16-25 micron height. In one exemplary conductive ball 7 on bonding pad 3 with a thickness of 1 micron is reduced to a thickness of approximately 16 microns in the heating process, photoresist frame 6b has a thickness of 17 microns and second metal region 13 as well as bonding pad 12 a thickness of 8 microns, giving a micro-cavity with a height of maximum 25 microns.

FIG. 20 shows the substrate assembly of FIG. 19 after encapsulant material 8 has been deposited (116). FIG. 21 shows packaged electronic die 29 formed by cutting the substrate assembly of FIG. 19. It can be seen that encapsulant material 8 extends over electronic die 10a, around the sides of electronic die 10a and is in contact with the first major surface 31 of substrate 30 around the entire periphery of the electronic die 10a so as to form a seal around electronic die 10a. Packaged electronic die 29 includes a micro-cavity 80 that extends between substrate 30 and an active surface of electronic die 10a. Micro-cavity 80 has sides that include photoresist frame 6b and metal region 13.

FIGS. 22-24 illustrate an example in which the metal region (e.g., first metal region 2 shown above) is not formed on the device wafer 1 and the landing pad (e.g. landing pad 13 shown above) is not formed on the substrate. FIG. 22 illustrates a side cross-sectional view of an example in which steps 101-102 and 104-107 have formed an electronic die 10b having bonding pads 3, conductive balls 7 and photoresist frame 6c; after steps 108-110 have formed bonding pads 12, bonding pads 16 on second major surface 32 and vias 14; and after the electronic die 10b has been placed (112) over substrate 30. When the bonding process of steps 113-115 is performed conductive ball 7 will melt or be plastically deformed and the electronic die 10b will move toward substrate 30 such that photoresist frame 6c contacts the first major surface 31 of substrate 30. Photoresist frame 6c, will preferably be in direct contact with the first major surface 31 of substrate 30 along the entire length and breadth of photoresist frame 6c so as to form micro-cavity 80 around device 4.

FIG. 23 shows a side cross-sectional view of the substrate assembly of FIG. 22 after encapsulant material 8 has been deposited (116). FIG. 24 shows packaged electronic die 39 formed by performing a cutting process (118) on the substrate assembly of FIG. 23. It can be seen that encapsulant material 8 extends over electronic die 10b, around the sides of electronic die 10b and is in contact with the first major surface 31 of substrate 30 around the entire periphery of electronic die 10b so as to form a seal around electronic die 10b. Packaged electronic die 39 includes micro-cavity 80 that extends between substrate 30 and an active surface of electronic die 10. Micro-cavity 80 has sides that are formed only by photoresist frame 6c.

While examples and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for forming a packaged electronic die using a substrate and a device wafer, the method comprising:
    forming a plurality of bonding pads on the device wafer;
    depositing a photoresist layer over the device wafer;
    patterning the photoresist layer so as to form a photoresist frame that completely surrounds a device formed on the device wafer;
    depositing conductive balls over the bonding pads;
    cutting the wafer to form the electronic die;
    placing the electronic die over the substrate;
    heating and compressing the conductive balls so as to couple each conductive ball to one of the bonding pads and to the substrate, the heating and compressing moving the electronic die closer to the substrate such that the photoresist frame is in direct contact with the substrate or with a landing pad formed on the substrate;
    depositing a encapsulant material such that the encapsulant material covers the electronic die and the substrate;
    curing the encapsulant material so as to encapsulate the electronic die; and
    cutting the substrate to separate the packaged electronic die.

2. The method of claim 1 wherein the photoresist frame is in direct contact with a first major surface of the substrate.

3. The method of claim 2 wherein the photoresist frame comprises an epoxy-based photoresist.

4. The method of claim 3 wherein the photoresist frame has a height of 16-25 microns.

5. The method of claim 4 wherein the photoresist frame has a width of 15-20 microns.

6. The method of claim 1 further comprising forming a landing pad over the substrate, wherein the photoresist frame is in direct contact with the landing pad.

7. The method of claim 6 wherein the photoresist frame comprises an epoxy-based photoresist.

8. The method of claim 7 wherein the photoresist frame has a height of 16-25 microns.

9. The method of claim 8 wherein the photoresist frame has a width of 15-20 microns.

10. The method of claim 1 further comprising:
    forming a first metal region that extends completely around the device, the first metal region comprising one or more layers of metal, and
    wherein the photoresist frame is in contact with the first metal region and completely surrounds the device.

11. The method of claim 10 further comprising:
    depositing a second metal layer on the substrate; and
    patterning the second metal layer to form bonding pads on the substrate.

12. The method of claim 11 wherein the patterning of the second metal layer forms a second metal region that comprises a landing pad, wherein the photoresist frame is in direct contact with the second metal region.

13. The method of claim 12 wherein the photoresist frame comprises an epoxy-based photoresist.

14. The method of claim 13 wherein the photoresist frame has a height of 16-25 microns.

15. The method of claim 14 wherein the photoresist frame has a width of 15-20 microns.

\* \* \* \* \*